(12) United States Patent
Mozzetta (10) Patent No.: US 6,359,452 B1
(45) Date of Patent: *Mar. 19, 2002

(54) METHOD AND APPARATUS FOR TESTING AN ELECTRONIC ASSEMBLY

(75) Inventor: Richard P. Mozzetta, Nashua, NH (US)

(73) Assignee: Nortel Networks Limited, St. Laurent (CA)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/121,176

(22) Filed: Jul. 22, 1998

(51) Int. Cl.$^7$ .............................................. G01R 31/02
(52) U.S. Cl. ...................... 324/754; 324/758; 324/761
(58) Field of Search ................. 324/754, 755, 324/756, 757, 758, 759, 760, 761, 538, 73.1, 158.1, 72.5, 500; 439/66, 71, 482

(56) References Cited

U.S. PATENT DOCUMENTS

| | | | | |
|---|---|---|---|---|
| 4,747,784 A | * | 5/1988 | Cedrone | 439/71 |
| 5,055,777 A | * | 10/1991 | Bonelli et al. | 324/754 |
| 5,367,253 A | * | 11/1994 | Wood et al. | 324/158.1 |
| 5,502,397 A | * | 3/1996 | Buchanan | 324/754 |
| 5,506,510 A | * | 4/1996 | Blumenau | 324/754 |
| 5,530,371 A | * | 6/1996 | Perry et al. | 324/754 |
| 5,923,176 A | * | 7/1999 | Porter et al. | 324/754 |
| 5,990,697 A | * | 11/1999 | Kazama | 324/761 |
| 6,005,401 A | * | 12/1999 | Nakata et al. | 324/754 |
| 6,066,957 A | * | 5/2000 | Van Loan | 324/758 |

* cited by examiner

Primary Examiner—Safet Metjahic
Assistant Examiner—Anjan K. Deb
(74) Attorney, Agent, or Firm—Neil G. J. Mothew; W. Glen Johnson (57) ABSTRACT

A fixture for testing an electronic assembly including a printed circuit board includes a pin housing. An array of electrical pins are mounted to and extend from the pin housing. An electrical connector is in logic communication with the electrical pins. A structure is provided which aligns the pin housing with respect to the printed circuit board with the electrical pins facing the printed circuit board. A device is provided which serves to secure the pin housing to the printed circuit board.

11 Claims, 9 Drawing Sheets

METHOD AND APPARATUS FOR TESTING AN ELECTRONIC ASSEMBLY

BACKGROUND OF THE INVENTION

1). Field of the Invention

The present invention generally relates to a method and apparatus for testing an electronic assembly. More specifically, the present invention relates to a method and apparatus for testing an electronic assembly comprising a printed circuit board and an electronics device such as an electronics package mounted to a first side of the electronics package, wherein a fixture is used with electrical pins contacting contact pads on a second side of the printed circuit board opposing the first side. The manner of contacting the printed circuit board, the printed circuit board itself, and aspects of the fixture are particularly suitable for high frequency testing.

2). Discussion of Related Art

Integrated circuits are usually manufactured in the form of a chip with a circuit formed in a surface of the chip. Such an integrated circuit is then mounted to a package substrate. The combination of the package substrate and the integrated circuit is called an electronics package. Electrical leads such as wireboarding wire or tape automated bonding (TAB) tape connect the integrated circuit to the package substrate. In other electronics packages the integrated circuit is mounted to a package substrate by an array of controlled collapse chip connect (C4) bumps which also place the integrated circuit in electrical communication with the package substrate.

The electronics package is then often mounted to a printed circuit board. In older assemblies the package substrate is glued or otherwise secured to the printed circuit board. Electrical wires extend from an opposing surface of the package substrate over an edge of the package substrate onto the printed circuit board, thereby placing the package substrate, and therefore also the integrated circuit, in electrical communication with the printed circuit board. Traces extend from the electrical wires to contact pads located around the package substrate on the printed circuit board. Pins of a test fixture can be brought into contact with the contact pads and an electrical tester connected to the electrical pins can be used to test the integrated circuit.

A large area is required around the package substrate on the printed circuit board in order to accommodate the contact pads, which increases the size and overall cost of the printed circuit board. Moreover, the traces on the printed circuit board increase resistance-capacitance delay, especially during high frequency testing, thus reducing signal integrity and limiting testing of the integrated circuit to lower frequencies.

Furthermore, a more recent development is to mount the package substrate to a printed circuit board by means of an array of solder balls located between the package substrate and the printed circuit board. The solder balls also connect the package substrate electrically to the printed circuit board. Traces may be formed on the printed circuit board, extending from the solder balls to contact pads around the electronics package. A primary advantage of mounting an electronics package to a printed circuit board by an array of solder balls is that a large number of balls can be used in the form of an array. However, a large number of solder balls only multiplies the problems associated with increased space on the printed circuit board and of resistance-capacitance delay.

What may therefore be required is a method and apparatus of testing an integrated circuit on an electronics package mounted to a printed circuit board, especially by means of an array of solder balls, wherein space is saved on the printed circuit board and, more particularly, wherein resistance-capacitance delay is reduced to facilitate high frequency testing.

SUMMARY OF THE INVENTION

According to one aspect of the invention a fixture for testing an electronic assembly including a printed circuit board is provided. The fixture includes a pin housing. An array of electrical pins are mounted to and extend from the pin housing. An electrical connector is within logic communication with the electrical pins. A structure is provided which aligns the pin housing with respect to the printed circuit board with the electrical pins facing the printed circuit board. A device is provided which serves to secure the pin housing to the printed circuit board.

The pin housing may include a test board, wherein the electrical connector is mounted to the test board. The electrical connector may be in logic communication with the electrical pins through traces formed on the test board.

A further aspect of the invention deals with the lengths of the electrical pins. The pins are preferably sufficiently short to allow for high frequency testing of the electronic assembly. The electrical pins are preferably less than 12 mm in length with an improvement in reliability for lengths less than 6 mm. The electrical pins are typically less than 3.5 mm, particularly for purposes of relaying test signals at frequencies above 300 MHz.

The structure for aligning the pin housing with respect to the printed circuit board may include an alignment shaft securable to the pin housing and extending through an alignment opening in the printed circuit board.

A clamping component may be securable to the pin housing with the printed circuit board located between the pin housing and the clamping component.

In order to depress a large number of electrical pins, typically in the range of between 300 and 1200 electrical pins, the device for securing the pin housing to the printed circuit board preferably includes a threaded portion.

According to another aspect of the invention, apparatus is provided for testing an electronic assembly including a printed circuit board. The apparatus includes a pin housing. An array of electrical pins, for contracting the printed circuit board, are mounted to and extend from the pin housing. An electrical tester is in logic communication with the electrical pins. The electrical tester may operate at at least 25 MHz and up to (but not limited to) 250 MHz.

In order for the electrical tester to accurately relay signals at high frequencies the electrical pins may be less than 6 mm in length, but preferably less than 3.5 mm in length.

According to a further aspect of the invention, a method of testing an electronic assembly comprising a printed circuit board and an electronic device mounted to a first side of the printed circuit board is provided. According to the method an array of contact pads on a second side of the printed circuit board opposing the first side is contacted with an array of electrical pins mounted to and extending from a pin housing. Signals are then relayed through the electrical pins between the electrical tester and the electronic device. Electrical signals are transmitted through the printed circuit board, which is a shorter, more reliable path with lower resistance-capacitance delay, being particularly viable for high frequency testing.

The electrical pins are preferably relatively short to further reduce resistance-capacitance delay. A relatively large number of electrical pins may be used, typically at least 300 pins and the printed circuit board is preferably secured to the pin housing by means of a threaded portion.

BRIEF DESCRIPTION OF THE DRAWINGS

The invention is further described by way of examples with reference to the accompanying drawings wherein like reference numerals indicate like or similar components and wherein.

DETAILED DESCRIPTION OF THE INVENTION

A method and apparatus for testing an electronic assembly are described. In the following description, for purposes of explanation, specific details is set forth to provide a thorough understanding of the present invention. However, it will be apparent to one skilled in the art that these specific details are not required in order to practice the present invention.

Figure 1:
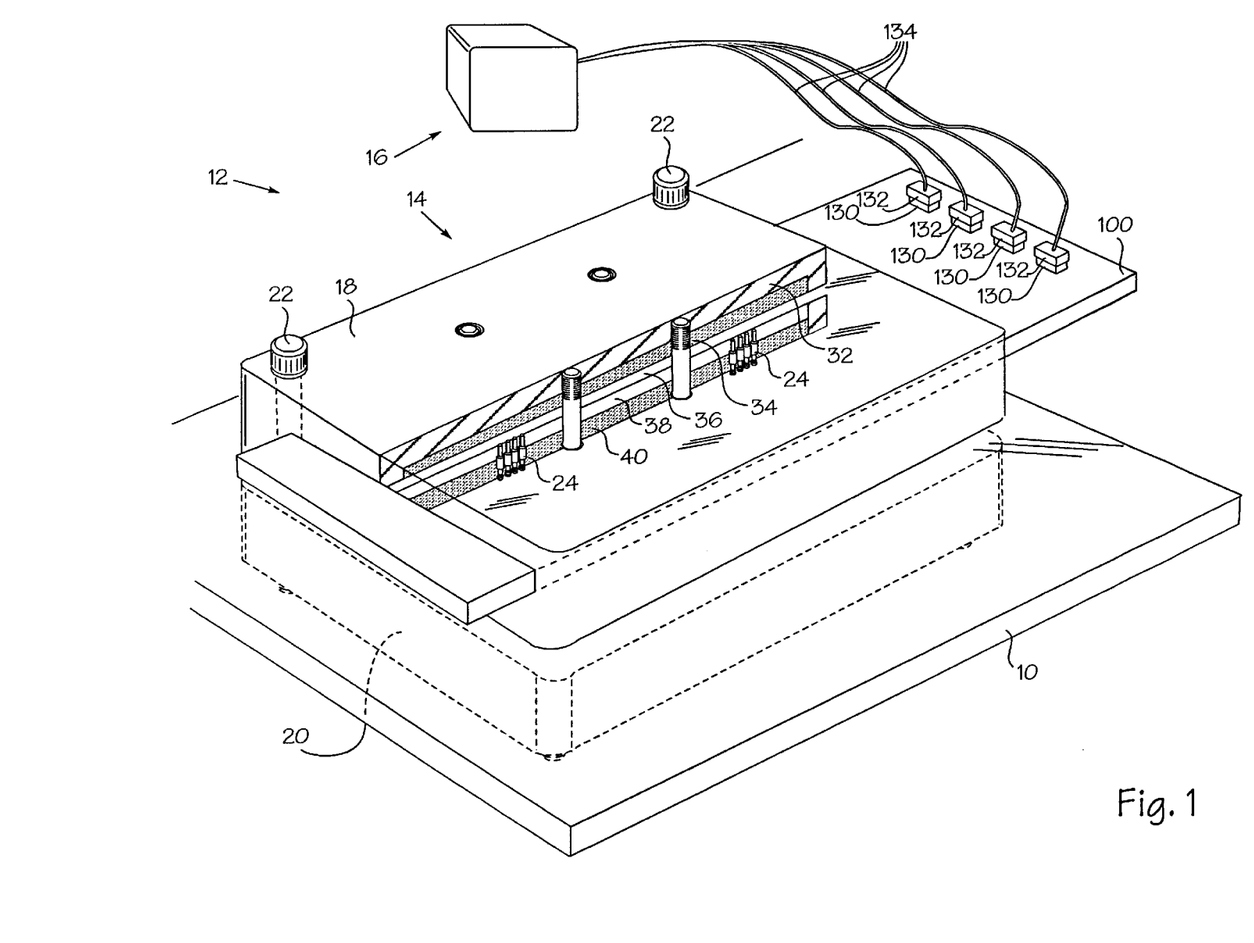
FIG. 1 is a perspective view of an electronic assembly and apparatus, according to one embodiment the invention, for testing the electronic assembly, the apparatus including a fixture, according to the invention, for engaging with the electronics assembly and an electrical tester connected to the fixture.

Referring in particular to the accompanying drawings, FIG. 1 illustrates an electronic assembly 10 and apparatus 12 for testing the electronic assembly 10.

The apparatus 12 for testing the electronic assembly 10 includes a fixture 14 and an electrical tester 16.

The fixture 14 includes a pin housing 18 located above the electronic assembly 10, and a clamping component 20 located below the electronic assembly 10. Four alignment shafts 22 (only two shown) aligning the fixture 14 with respect to the electronic assembly 10 and secure corners of the pin housing 18 and corners of the clamping component 20 to one another with the electronic assembly 10 clamped between the pin housing 18 and the clamping component 20.

Figure 2:
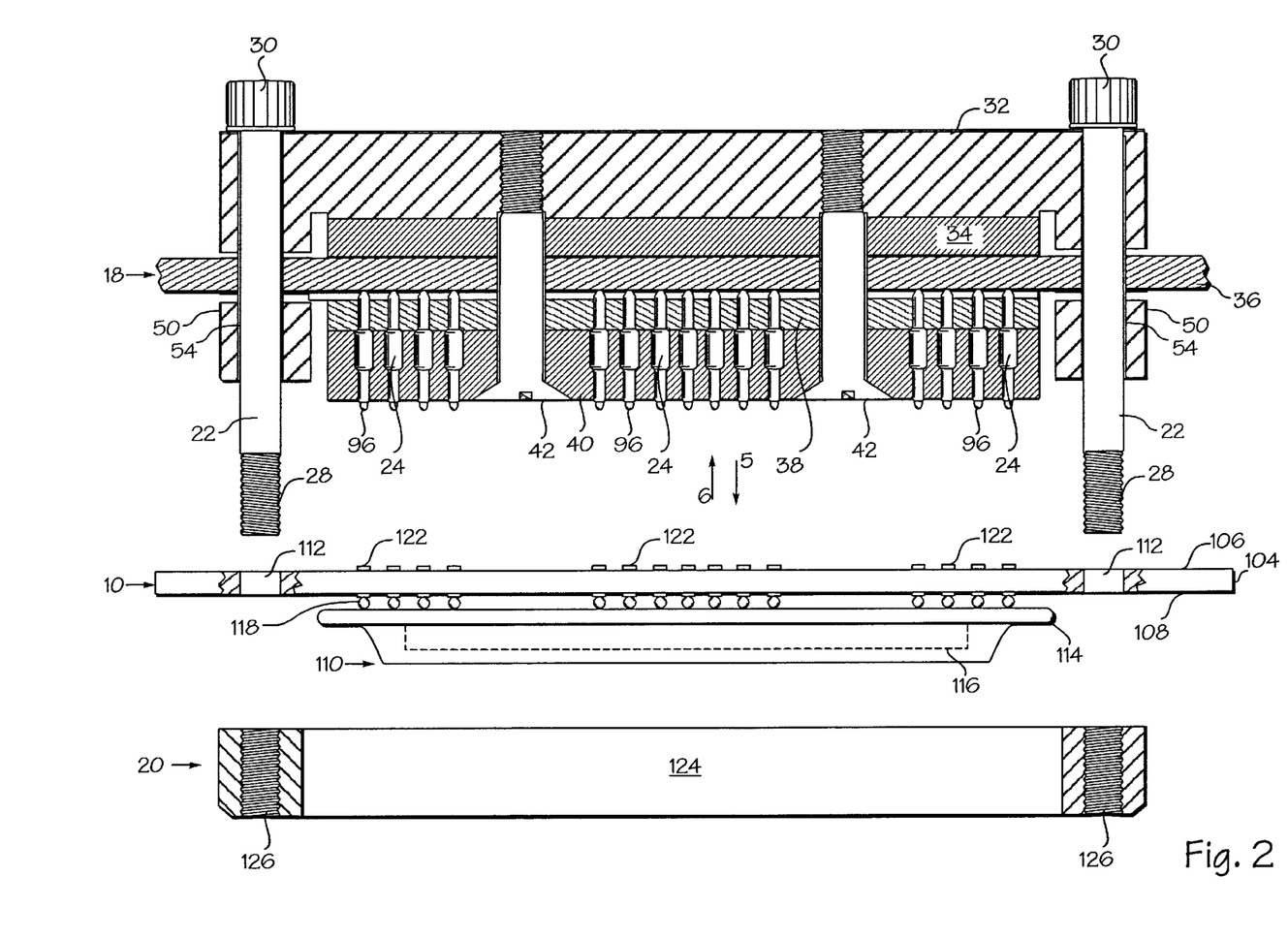
FIG. 2 is a sectioned and exploded side view of a pin housing and a clamping component, of the fixture, and the electronic assembly before the electronic assembly is clamped between the pin housing and the clamping component.

FIG. 2 shows the pin housing 18, the electronic assembly 10 and the clamping component 20 in exploded form.

Figure 3:
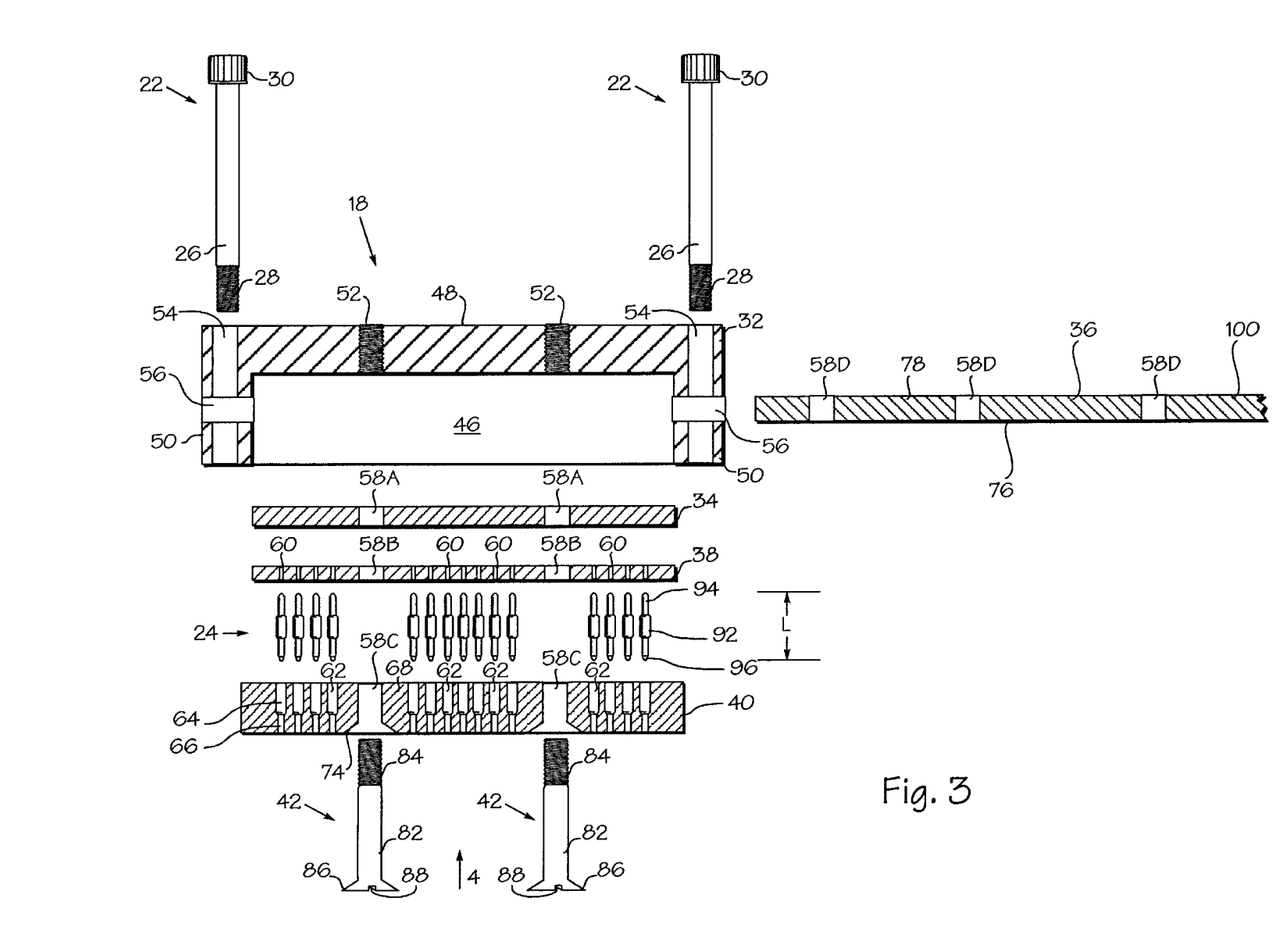
FIG. 3 is a sectioned side view showing in exploded form the components out of which the pin housing is assembled.

FIG. 3 shows the pin housing 18, two of the alignment shafts 22, and an array of electrical pins 24 in exploded form.

Each alignment shaft 22 includes an elongate section 26 having a lower threaded portion 28 and a head 30 secured at an upper end of the elongate section 26. Groove formations are preferably formed around a circular surface of the head 30 so as to facilitate turning of the alignment shaft 22 by hand.

The pin housing 18 includes a body 32, a padded insert 34, a test board 36, first and second halves 38 and 40 for locating of the pins 24, and four assembly screws 42 (only two shown).

The body 32 is preferably made of an electrically insulative material. One electrically insulative material which may be used for purposes of manufacturing the body 32 out of is known in the art as G10. Other materials may alternatively be used for purposes of manufacturing the body 32.

The body 32 is formed with a recess 46 which leaves the body 32 with a back portion 48 forming a base of the recess 46 and flanges 50 extending from an edge of the back portion 48 and forming side walls of the recess 46. The recess 46 is generally sufficiently wide and deep to accommodate the padded insert 34, the test board 36, the first and second halves 38 and 40 and the pins 24. Although only two flanges 50 are shown in cross section, it should be understood that the body 32 has four flanges 50, each extending from a respective edge of the back portion 48 and each forming a respective side wall of the recess 46.

Four threaded holes 52 are tapped into the back portion 48 of the body 32. Each threaded hole 52 extends from the recess 46 through the back portion 48 to an opposing surface of the back portion 48. Although only two threaded holes 52 are shown in cross section, it should be understood that there are typically four threaded holes 52 tapped through the back portion 48, substantially in a rectangular configuration near the center of the back portion 48.

Alignment holes 54 are formed through the body 32. Although only two alignment holes 54 are shown in cross section, it should be understood that there are typically four alignment holes 54, each in a respective corner of the body 32. Each alignment hole 54 is formed longitudinally through the flanges 50 and through the back portion 48.

A longitudinal slot 56 is formed through each of the flanges 50 of the body 32. Each longitudinal slot 56 extends from the recess 46 through the flange 50 to an opposing surface of the body 32. Although not shown in FIG. 3, it should be understood that each longitudinal slot 56 has a width which substantially conforms to the width of the recess 46 in the body 32.

The padded insert 34 may be made of any compliant material such as neoprene rubber or the like. Holes 58A are formed through the padded insert 34. Although only two holes 58A are shown in cross section, it should be understood that four holes 58A are typically formed through the padded insert 34, substantially in a rectangular configuration.

The first half 38 is in the form of a sheet which may also be manufactured from an electrically insulative material such as G10. Pin locating holes 60 are formed through the first half 38. Although only a few pin locating holes 60 are shown in cross section it should be understood that the pin locating holes 60 are typically in the form of an array in the first half 38.

Holes 58B are also formed through the first half 38. Although only two holes 58B are shown in cross section, it should be understood that four holes 58B are typically formed through the first half 38, substantially in a rectangular configuration.

The second half 40 is also in the form of a sheet which may also be manufactured from an electrically insulative material such as G10.

Pin locating openings 62 are formed through the second half 40. Although only a few pin locating openings 62 are shown in cross section, it should be understood that the pin locating openings 62 are typically also in the form of an array in the second half 40. Each pin locating opening 62 has a first length 64 extending from a first side 68 of the second half 40 and a second length 66 extending from the first length 64 to a second side 70 of the second half 40 opposing the first side 68, wherein the first length 64 has a relatively large diameter and the second length 66 has a relatively small diameter.

Holes 58C are also formed through the second half 40. Although only two holes 58C are shown in cross section, it should be also understood that four holes 58C are typically formed through the second half 40, substantially in a rectangular configuration.

The holes 58C formed through the second half 40 are bored from the second side 70. A sharp tip bore is used so that a tapered seat 74 is formed at a mouth of each hole 58C.

The test board 36 may be a conventional printed circuit board having contact pads, traces, etc. which are specifically designed for use in the fixture 14. Contact pads (not shown) may be formed on a first surface 76 of the test board 36. The contact pads on the first surface 76 of the test board 36 may be in the form of an array, similar to the arrays of pin locating holes 60 and the pin locating openings 62 in the first and second halves 38 and 40 respectively. Vias (not shown) extend from the contact pads on the first surface 76 of the test board 36 to a second surface 78 of the test board 36 opposing the first surface 76, and traces (not shown) are formed on the second surface 78 and are connected to the vias.

Holes 58D are formed through the test board 36. Although only two holes 58D are shown in cross section, it should be understood that four holes 58D are typically formed through the test board 36, substantially in a rectangular configuration.

Each assembly screw 42 has an elongate portion 82 having a threaded end 84, and a head 86 on an opposing end of the elongate portion 82. The head 86 is tapered and has a tool engaging slot formation 88.

Each electrical pin 24 has a main body 92 and first and second tips, 94 and 96, respectively, on opposing ends of the main body 92. Each tip 94 and 96 is depressable into the main body 92 against a spring force. Each electrical pin 24 has a length L. Preferred lengths L of the electrical pins 24 are further discussed hereinbelow. Between 300 and 1200 electrical pins 24 may be provided although typically about 355 pins are provided.

The pin housing 18 and pins 24 are assembled by first positioning the padded insert 34 inside the recess 46 against the back portion 48 of the body 32. The padded insert 34 is dimensioned to substantially fit in between the flanges 50 in the recess 46. The holes 58A in the padded insert 34 are positioned so that they align with the threaded holes 52 in the back portion 48 of the body 32.

Next the test board 36 is inserted through the slot 56 into the recess 46 in the body 32. Once the test board 36 is inserted into the recess the padded insert 34 is located between the test board 36 and the back portion 48 of the body 32 with the second surface 78 of the test board 36 contacting the padded insert 34. The holes 58D in the test board 36 are positioned to be aligned with the holes 58A in the padded insert 34 and the threaded holes 52 in the back portion 48 of the body 32 on the test board 36. Once inserted into the recess 46, the test board 36 has an end 100 which extends out of the elongate slot 56. The contact pads (not shown) on the first surface 76 of the test board 36 are then located within the recess 46 and facing out of the recess.

The electrical pins 24 are positioned within the pin locating openings 62 in the second half 40. Each electrical pin 24 is inserted into a respective pin locating opening 62 with the main body 92 of the electrical pin 24 positioned within the first length 64 of the pin locating opening 62 and the second tip 96 of the electrical pin 24 extending through the second length 66 of the pin locating opening 62 and protruding from the second half.

The first half 38 is then positioned over the first half 40 containing the electrical pins 24 so that each of the pin locating holes 60 is aligned with a respective pin 24. The first half 38 and the second half 40 are then moved towards one another until the first tips 94 of the electrical pins 24 extend through the pin locating holes 60 and protrude from the first half 38. The pins 24 are so held captive between the first half 38 and the second half 40 with the first and second tips 94 and 96 respectively extending from the first and second halves 38 and 40.

The first and second halves 38 and 40 are then inserted together with the pins 24 into the recess. The first and second halves 38 and 40 are dimensioned to snugly fit between the flanges 50. The pin locating holes 60 and the pin locating openings 62 in the first and second halves 38 and 40 are arranged to position the electrical pins 24 within the recess 46 in the body 32 in such a manner that each electrical pin 24 is aligned with a respective contact pad (not shown) on the first surface 76 of the test board 36. Once the first and second halves 38 and 40 are fully inserted into the recess 46 in the body 32, a respective first tip 94 of each pin 92 contacts a respective contact pad (not shown) on the first surface 76 of the test board 36.

The holes 58B and 58C in the first and second halves 38 and 40 are aligned with the holes 58D in the test board 36, the holes 50A in the padded insert 34 and the threaded holes 52 in the back portion 48 of the main body 32.

Each assembly screw 42 is then inserted through a respective hole 58C in the second half 40, a respective hole 58B in the first half 38, a respective hole 58D in the test board 36 and a respective hole 58A in the padded insert 34. A component of a tool such as a tip of a screwdriver may then be engaged within the slot formation 88 in the head 86 of the assembly screw 42. The tool may then be used to rotate the assembly screw 42 so that the threaded end 84 on the elongate portion 82 of the assembly screw 42 screws into a respective threaded hole 52 in the back portion 48 of the body 32. The assembly screws 42 are so engaged with the body 32. The assembly screws 42 may then be further screwed into the body so that the heads 86 of the assembly screws 42 engage with the tapered seats 74 in the second side 70 of the second half 40. Further rotation of the assembly screws 42 pulls the first and second halves 38 and 40 (containing the electrical pins 24), the test board 36 and the padded insert 34 against the back portion 48 of the body 32. Damage to the test board 36 may be prevented by compliance or depression of the padded insert 34. The elongate portions 82 of the assembly screws 42 may fit snugly within the holes 58A, 58B, 58C, and 58D so as to provide alignment of the padded insert 34, the test board 36, and the first and second halves 38 and 40 with respect to the body 32.

The alignment shafts 22 may then be inserted through the alignment holes 54. The elongate section 26 of each alignment shaft 22 preferably fits into a respective alignment hole 54 with a slide fit having a relatively tight tolerance.

Referring again to FIG. 2, the pin housing 18 is shown fully assembled with the second tips 96 of the electrical pins 24 extending from the pin housing 18 and the ends of the alignment shafts 22 extending through the alignment 54 in the flanges 50.

The electronic assembly 10 includes a printed circuit board 104 having a first side 106 and a second side 108, and an electronic device such as an electronics package 110 mounted on the second side 108 of the printed circuit board 104. Alignment openings 112 are formed through the printed circuit board 104. Although only two alignment openings 112 are shown in cross section, it should be understood that four alignment openings 112 are typically formed, substantially in a rectangular configuration, through the printed circuit board 104.

The electronics package 110 includes a package substrate 114 and an integrated circuit 116 mounted on the package substrate 114. The integrated circuit 116 has a circuit formed therein and is electrically connected to pads (not shown) on the package substrate by an array of controlled collapse chip connect (C4) bumps, by wirebonding wire, by tape automated bonding (TAB), or by any other means. Further aspects of electronics packages are known in the art and are not discussed in detail. Suffice to say that electronics package 110 is mounted to the second side 108 of the printed circuit board 104 by an array of solder balls 118 which are located between the package substrate 114 and the printed circuit board 104 and heated in a reflow furnace. Heating of the solder balls 118 results in adhesion of the solder balls 118 to the package substrate 114 and to the second surface 108 of the printed circuit board 104.

Figure 4:
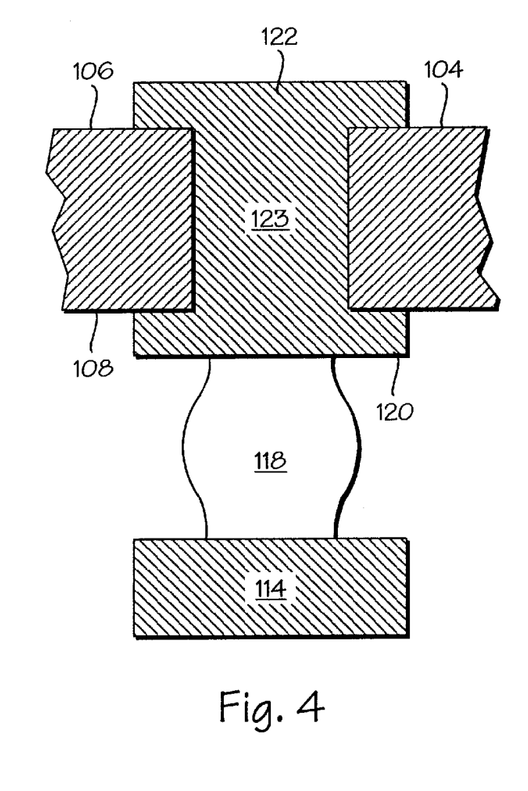
FIG. 4 is a sectioned side view of a portion of the electronic assembly.

FIG. 4 is a view of a portion of the package substrate 114, the printed circuit board 104 and one of the balls 118. Bond pads 120 are formed on the second side 108 of the printed circuit board 104 and contact pads 122 are formed on the first side 106 of the printed circuit board 104. Vias 123 are formed through the printed circuit board 104 and connect the bond pads 120 and the contact pads 122 to one another. The arrangement of the bond pads 120, the contact pads 122 and the vias 123 are shown schematically in what is known in the art as a via-in-pad configuration. It should be understood that any other configuration such as the known dogbone configuration may be used.

Each ball 118 is located between a respective bond pad 120 and the package substrate. The package substrate 114 is mounted to the bond pads 120 by means of the balls 118 and the balls 118 connect the package substrate 114 (and the integrated circuit 116) electrically to the contact pads 122.

Referring again to FIG. 2, the clamping component 20 is in the form of a rectangular ring, having a central opening 124. Securing holes 126 are formed through the clamping component 20. Each securing hole 126 is tapped so as to have a threaded section extending through the clamping component 20. Although only two securing holes 126 is shown in cross section, it should be understood that four securing holes 126 are typically formed, each through a respective corner of the clamping component 20. The clamping component may also be made of an electrically insulative material such as G10.

In order to assemble the fixture 14 and the electronic assembly 10, the electronic assembly 10 is first positioned so that the first surface of the printed circuit board 104 faces the second tips 96 of the pins 24. The alignment openings 112 in the printed circuit board 104 are located in an arrangement similar to the alignment holes 54 in the body 32 of the pin housing 18 so that the alignment openings 112 in the printed circuit board 104 can be aligned with the alignment shafts 22. The electronic assembly 10 and the pin housing 18 are then moved towards one another, thereby inserting the threaded portions 28 of the shafts 22 through the alignment openings 112 in the printed circuit board 104. The alignment openings 112 in the printed circuit board 104 preferably fit over the shafts 22 with relatively little tolerance so as to limit lateral movement of the electronic assembly 10 relative to the pin housing 18.

Once the electronic assembly 10 is located in place over the pin housing 18, the clamping component 20 is positioned over the electronic assembly 10 with the package substrate 100 located within the central opening 124 of the clamping component 120. Each alignment shaft 22 is aligned with a respective securing hole 126 in the clamping component 20. When a head 30 of one of the alignment shafts 22 is turned, the threaded portion 28 of the alignment shaft 22 screws into the threaded section of a respective securing hole 126 in the clamping component 20. By screwing the alignment shafts 22 into the clamping component 20, the clamping component 20 and the pin housing 18 are drawn towards one another, thereby clamping the printed circuit board 104 between the clamping component 20 and the second tips 96 of the pins 24. The second tips 96 of the pins 24 are thereby depressed. The screw engagement of the shafts with the securing holes 126 is particularly suitable to overcome a relatively large force required to depress the second tips 96 of the relatively large number of pins 24.

Figure 7:
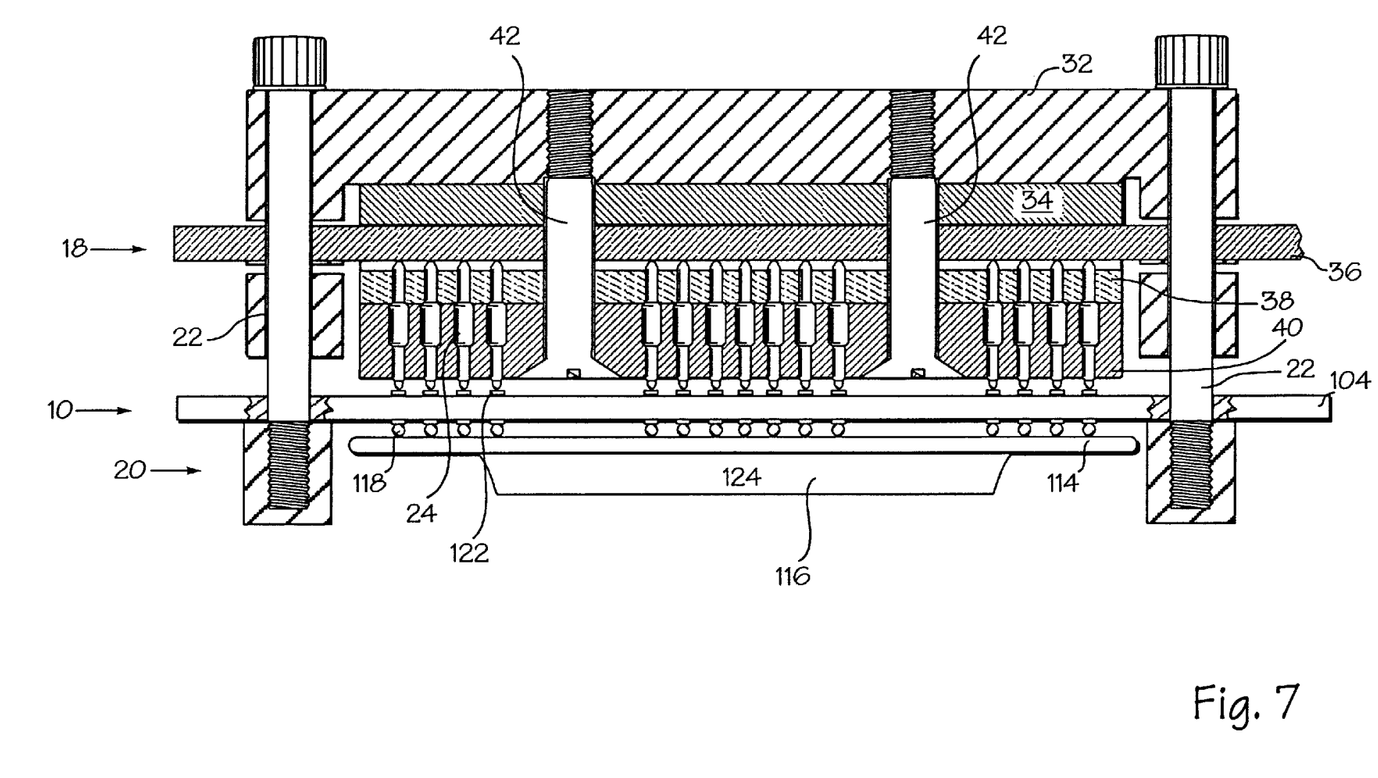
FIG. 7 is a sectioned side view of the fixture and the electronic assembly, showing the electronic assembly clamped between the pin housing and the clamping component.

FIG. 7 illustrates the fixture 14 and the electronic assembly 10 when fully assembled.

Figure 5:
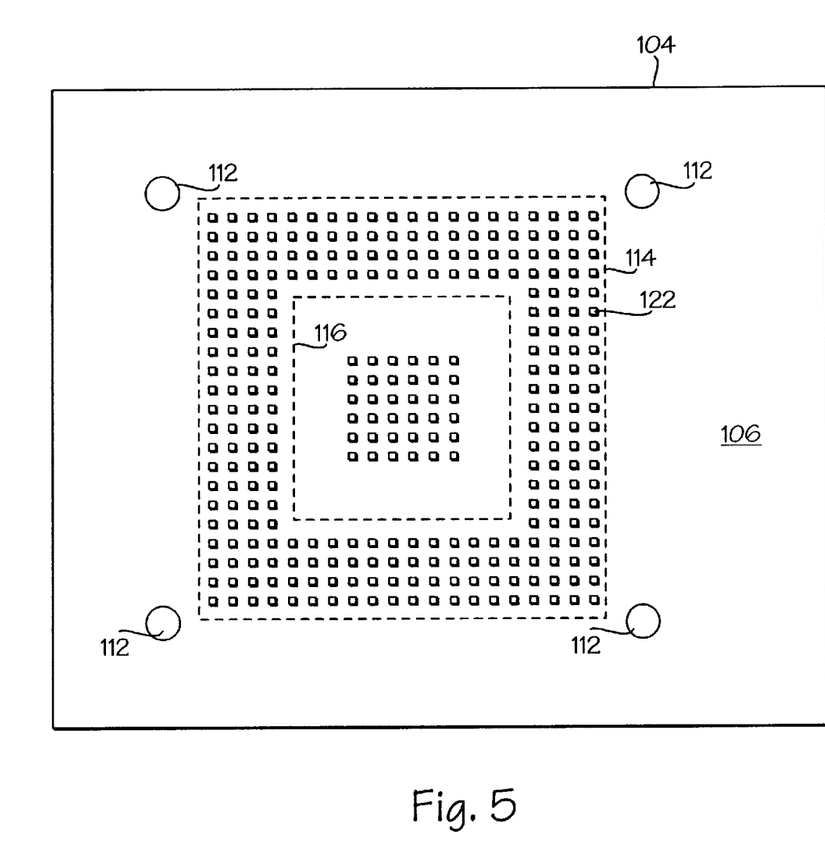
FIG. 5 is a view in a direction indicated by the arrow 5 in FIG. 2 of the electronic assembly, in particular showing the arrangement of an array of contact pads.

FIG. 5 is a view in a direction indicated by the arrow 5 in FIG. 2 of the first surface 106 of the printed circuit board 104, showing the arrangement of contact pads 122 and the positioning of the alignment openings 112. The outlines of the package substrate 114 and the integrated circuit 116 on the second surface 108 of the printed circuit board 104 are also shown in hidden lines. As mentioned previously, the alignment openings 112 are in substantially a rectangular configuration. The contact pads 122 are in the form of a central array and an outer array. The arrays match the positioning of the solder balls 118 on the second surface 108 of the printed circuit board 104. It should be noted that the arrays will vary in size and position based on the device utilized on the printed circuit board.

Figure 6:
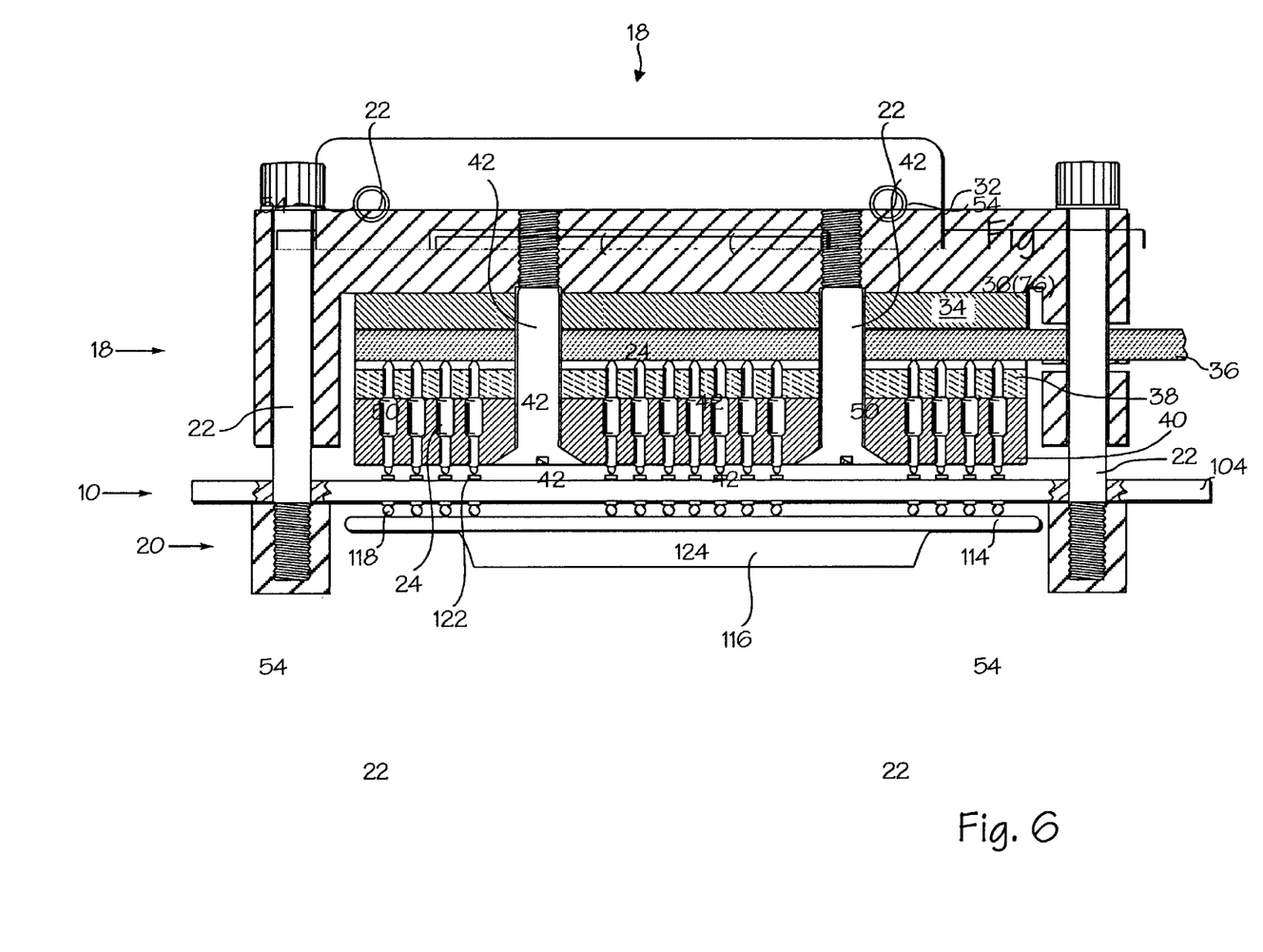
FIG. 6 is a view in a direction indicated by the arrow 6 in FIG. 2 of the pin housing, in particular showing the arrangement of an array of pins.

FIG. 6 is a view indicated by the arrow 6 in FIG. 2 of the pin housing, showing the arrangement of the electrical pins 24 and the positioning of the alignment shafts 22 and the assembly screws 42. The alignment shafts 22 extend through alignment holes 54 at corners of the flanges 50. The electrical pins 24 are in the form of a central array and an outer array and the assembly screws 42 are located in a rectangular arrangement between the central array and the outer array. Again, the location of the pins 24 and screws 42 may vary depending on the respective locations of the central and outer arrays of contact pads 122.

A comparison of FIGS. 5 and 6 shows that the arrays of contact pads 122 on the first surface 106 of the printed circuit board 104 is reflected by the arrays of electrical pins 24 on the pin housing 18. Each electrical pin 24 therefore contacts a respective contact pad 122 when the fixture 14 and the electronic assembly 10 are a final assembly, as shown in FIG. 7.

Referring again to FIG. 1, an inset cross section of the pin housing 18 is also shown, including the body 32, the padded insert 34, the test board 36 and the first and second halves 38 and 40 which house the electrical pins 24.

A number of electrical connectors 130 are mounted to the end 100 of the test board 36 extending out of the body 32. As previously mentioned, traces (not shown) are formed on the test board 36. Female connectors 132 are engaged with the electrical connectors 130. The female connectors 132, in turn, are connected to the electrical tester 16 by means of electrical cables 134.

The electrical tester 16 is therefore placed in electrical communication with the integrated circuit 116 of the electronic assembly via the electrical cables 134, the female connectors 132, the mating connections 132, the electrical connectors 130, the traces (not shown) on the test board 36, the vias (not shown) extending through the test board 36, the contact pads (not shown) on the test board 36, the electrical pins 24, the contact pads 122 on the printed circuit board 104 and the vias 123 in the printed circuit board 104, the bond pads 120 on the printed circuit board 104 and the solder balls 118 connected to the package substrate 114.

An advantage of using the fixture 14 for testing an integrated circuit deals with the dimensions and configuration of the electrical pins 24 and the vias 123 in the printed circuit board 104, particular for high frequency testing purposes. For example, the electrical tester 16 may operate at between 25 and 250 MHz thereby relaying signals through the vias 123 and the electrical pins 24 in order to test the integrated circuit 116. Such an electrical tester may, for example, be a Hewlett Packard Logic Analyzer. For the electrical tester to operate at a high frequency it is important that each electrical pin 24 has a length L (FIG. 3) of less than 12 mm. An improvement in reliability of testing at high testing frequencies can be obtained if the electrical pins 24 are less than 6 mm in length. In one embodiment the electrical pins are less than 3.5 mm in length and the electrical tester operates at a frequency of 300 MHz.

Also important to note is that electrical contact is made (by means of the electrical pins 24) on a side of the printed circuit board 104 opposing the electronics package 110. The electronics package 110 is therefore in electrical communication with the electrical pins 24 through the relatively short vias 123 extending through the printed circuit board 104. Due to the relatively short dimensions of the vias 123 with a correspondingly lower resistance-capacitance delay, relatively high frequency testing can be obtained. There is also no need for extra traces or contact pads taking up space on the second side 108 of the printed circuit board 104.

Figure 8:
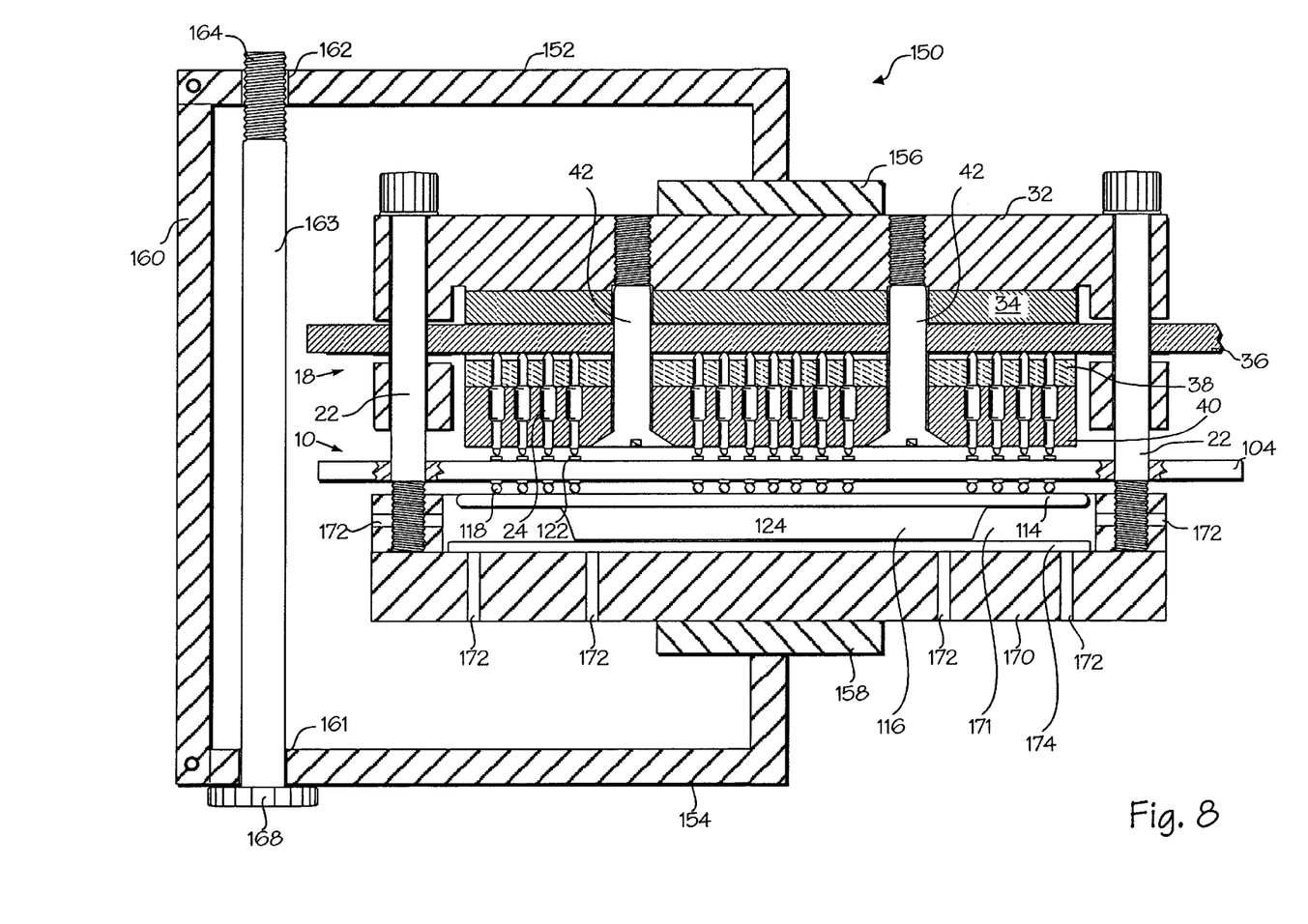
FIG. 8 is a sectioned side view of a fixture and electronic assembly, according to a further embodiment of the present invention, showing the electronic assembly clamped between the pin housing and a clamping component.

FIG. 8 is a sectioned side view of a fixture and electronic assembly, according to a further embodiment of the present invention. The embodiment illustrated in FIG. 8 is substantially similar to that shown in FIG. 7, but includes a clamping apparatus 150 which serves to bias the body 32, which carries the pins 24, towards the PCB 104, so that the pins make logical or electrical contact with the contact pads 122. The clamping apparatus 150, in one exemplary embodiment, comprises a pair of L-shaped jaws 152 and 154, each jaw having a respective foot 156 or 158 at a free end thereof, the foot 156 acting on the body 132 while the foot 158 acts on a clamping component 170. Specifically, the clamping component 170 comprises a rectangular block having a recess 171 defined in an operatively upper surface thereof, the recess 171 being sized to accommodate the package substrate 114 and integrated circuit 116 when secured to the front side of the PCB 104.

Returning to the clamping apparatus 150, each of the jaws 152 and 154 is pivotally attached to a spine 160, and has a respective hole 161 or 162 defined therein adjacent a pivoted end thereof. The hole 162 defined in the arm 152 is internally threaded. The holes 161 and 162 are furthermore sized to receive a pin 163, which is threaded at one end thereof to complement the internal thread of the hole 162. The pin 163 has a disk 168 secured at the other end thereof. The external perimeter of the disk 168 is grooved or knurled. It will be appreciated, that by rotating the disk 168, the pin 163 is rotated, thus causing a threaded section 164 of the pin 163 to engage with the internal thread of the hole 162. The jaws 152 and 154, and accordingly the body 32 and the PCB 104, are thus biased towards each other.

To protect the integrated circuit 116, the internal bottom surface of the recess 171 may be covered with a cushioned pad 74. Furthermore, the clamping component 20 may have a number of ventilation holes 172 located therein so as to allow air, which may be operatively trapped within the recess 171 by the PCB 104, to escape and thus not to hinder the compression or biasing of the entire assembly as described above.

It will be appreciated that the illustrated clamping apparatus 150 is merely one example of many clamping apparatuses which could serve to exert a clamping or biasing force that operates to bring the pin 24 into electrical or logical contact with the contact pads 22 on the PCB 104.

Figure 9:
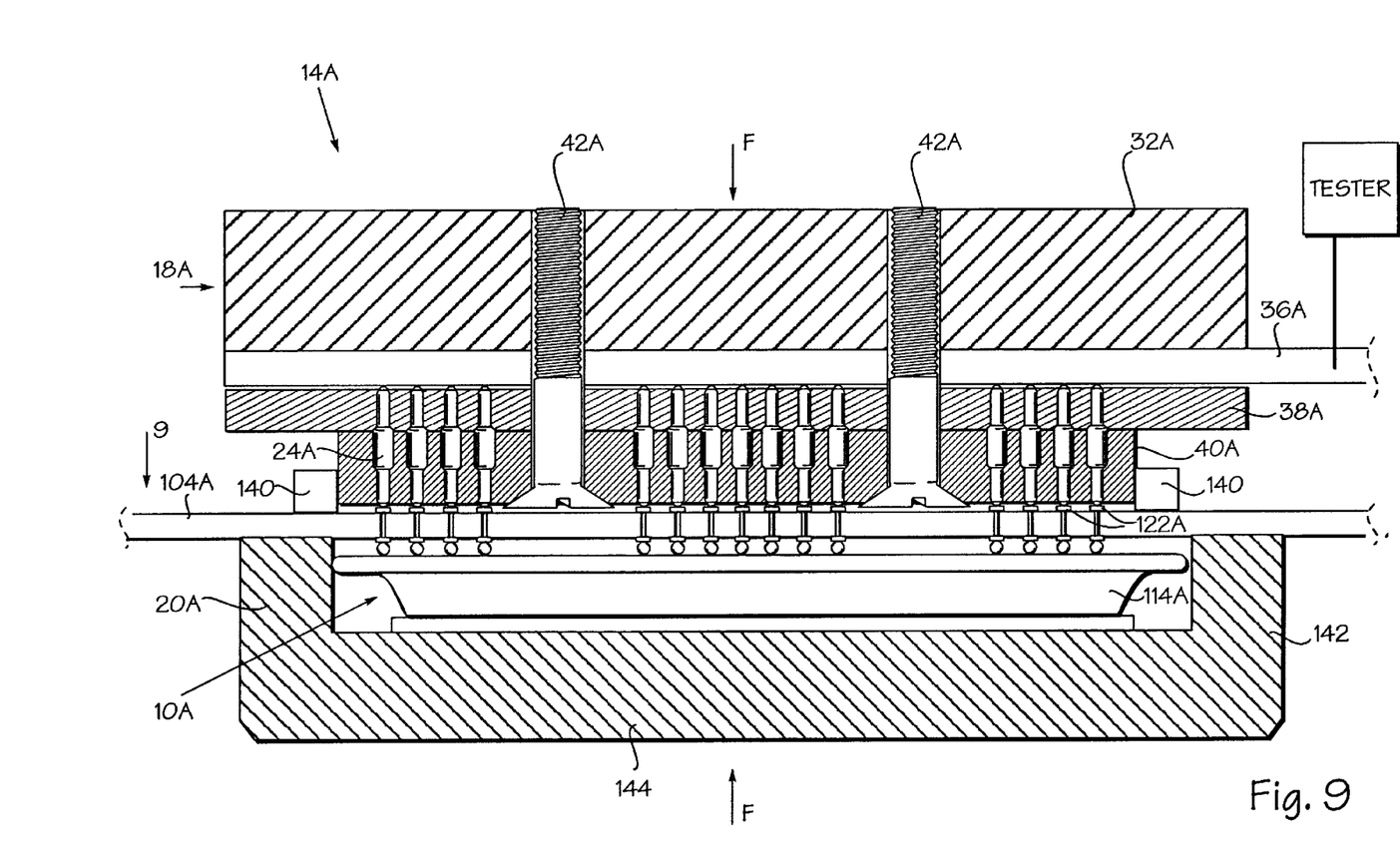
FIG. 9 is a sectioned side view of a fixture and an electronic assembly, according to another embodiment of the invention, wherein alignment blocks are mounted to the electronic assembly for purposes of aligning a pin housing of the fixture with respect to the electronic assembly.
Figure 10:
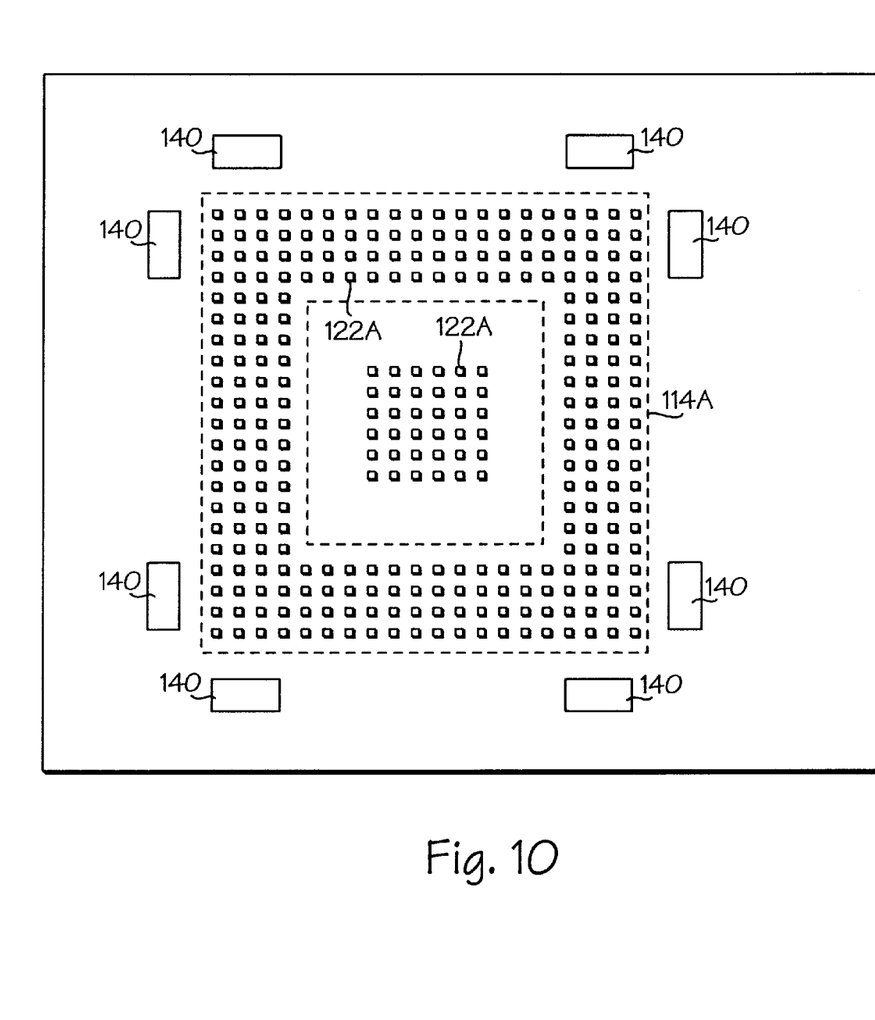
FIG. 10 is a view in a direction indicated by the arrow 9 in FIG. 9 of the electronic assembly, illustrating the positioning of the alignment blocks.

FIG. 9 shows a fixture 14A for testing an electronic assembly 10A according to an alternative embodiment of the invention.

The electronic assembly 10A includes a printed circuit board 104A, and is similar to the electronic assembly 10 of FIG. 7.

The fixture 14A is similar to the fixture 14 of FIG. 7. The fixture 14A therefore also includes a pin housing 18A and a clamping component 20A. The pin housing 18A includes a block body 32A with a test board 36A and first and second halves 38A and 40A which are secured to the block body 32A by means of assembly screws 42A. Electrical pins 24A are located within the first and second halves 38A and 40A.

Alignment blocks 140 are mounted to the printed circuit board. The pin housing 18A is aligned with respect to the electronic assembly 10A with the second half 40A between the alignment blocks 140. The pin housing 18A and the electronic assembly 10A are then moved towards one another so that the second half 40A is received between the alignment blocks 140. The alignment blocks 140 are positioned so as to align the second half 40A with respect to the electronic assembly 10A with each of the pins 24A contacting a respective contact pad 122A on the printed circuit board 104A. FIG. 9 is a view in a direction indicated by the arrow 9 in FIG. 8, showing the arrangement of the alignment blocks 140 around the contact pads 122A.

The clamping component 20A includes a rectangular ring portion 142 and a backing plate 144 on one side of the ring portion 142. The ring portion 142 rests against the printed circuit board 104A and the backing plate rests against the electronic package 114A. A clamping device (not shown) or the like may be used to move the pin housing 18A and the clamping component 20A towards one another with a force F. The force F is sufficient to compress the electrical pins 24A, thereby ensuring proper contact and engagement of all the electrical pins 24A with the contact pads 122A.

The fixture 14A shown in FIG. 9 is advantageous in that more PCB routing area is facilitated. Specifically, no alignment openings 112 are formed in the PCB 104A and accordingly the area occupied by these openings in the embodiments described with reference to FIGS. 1–9 is available for routing. The alignment blocks 140 are secured to the PCB 104A by a normal solder process, and accordingly effect routing only on one (1) layer, namely the backside layer.

What is claimed:

1. An electronic testing apparatus, comprising:
   a pin housing defining a first surface;
   an array of electrical pins mounted to and extending from the first surface of said pin housing; and
   a plurality of alignment shafts disposed in said pin housing substantially circumscribing said array of electrical pins, at least one of said alignment shafts including a lower portion extending from the first surface of said pin housing distal to said array of electrical pins capable of releasably securing said array of electrical pins into electrical communication with a printed circuit board.

2. The apparatus of claim 1, wherein the plurality of alignment shafts are disposed in said pin housing in spaced-apart relative alignment.

3. The apparatus of claim 2, wherein
   the first surface defines a substantially rectangular perimeter having corners; and
   wherein said plurality of alignment shafts are disposed proximate at least one of the corners of the first surface perimeter.

4. The apparatus of claim 1, wherein
   each said alignment shaft includes a lower portion extending from the first surface of said pin housing; and
   the circuit board defines a corresponding plurality of alignment openings to receive said alignment shaft lower portions.

5. The apparatus of claim 4, wherein
   said alignment shaft lower portions extend through the circuit board alignment openings when said array of electrical pins is in electrical communication with the circuit board; and
   wherein the apparatus further comprises a clamping component receiving said alignment shaft lower portions to secure said pin housing to the circuit board.

6. The apparatus of claim 1, wherein said electrical pins are depressible against a spring force.

7. The apparatus of claim 1, wherein said electrical pins are metal.

8. An apparatus, comprising:
   a pin housing defining a first surface, the first surface having a perimeter;
   an array of electrical pins mounted to and extending from the first surface of said pin housing distal to the first surface perimeter; and
   a plurality of alignment shafts disposed proximate the first surface perimeter of said pin housing, at least one of said alignment shafts including a lower portion extending from the first surface of said pin housing distal to said array of electrical pins capable of releasably securing said array of electrical pins into electrical contact with a printed circuit board.

9. The apparatus of claim 8, wherein the plurality of alignment shafts are disposed in said pin housing in spaced-apart relative alignment.

10. The apparatus of claim 9, wherein
    the first surface perimeter is substantially rectangular defining corners; and
    wherein said plurality of alignment shafts are disposed proximate at least one of the corners of the first surface perimeter.

11. An apparatus, comprising:
    a pin housing defining a first surface;
    an array of electrical pins mounted to and extending from the first surface of said pin housing distal to the first surface perimeter; and
    securing means disposed peripherally of said array of electrical pins for releasably securing said array of electrical pins into electrical contact with a printed circuit board.

* * * * *